United States Patent
Drndic et al.

(10) Patent No.: US 7,887,720 B2
(45) Date of Patent: *Feb. 15, 2011

(54) POLYMER-NANOCRYSTAL QUANTUM DOT COMPOSITES AND OPTOELECTRONIC DEVICES

(75) Inventors: Marija Drndic, Philadelphia, PA (US); Sandra Zivanovic, Ruston, LA (US); Difei Qi, Ruston, LA (US)

(73) Assignees: The Trustees of the University of Pennsylvania, Philadelphia, PA (US); Louisiana Tech University Foundation, Inc., Ruston, LA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/608,348

(22) Filed: Oct. 29, 2009

(65) Prior Publication Data

US 2010/0207066 A1    Aug. 19, 2010

Related U.S. Application Data

(62) Division of application No. 11/348,039, filed on Feb. 6, 2006.

(60) Provisional application No. 60/650,476, filed on Feb. 7, 2005, provisional application No. 60/667,935, filed on Apr. 4, 2005.

(51) Int. Cl.
*H01B 1/12* (2006.01)
*H01L 29/08* (2006.01)
*H01L 31/042* (2006.01)

(52) U.S. Cl. ............... 252/519.33; 252/519.34; 252/500; 257/40; 136/250

(58) Field of Classification Search ............ 252/519.33, 252/519.34; 257/40; 136/250
See application file for complete search history.

(56) References Cited

U.S. PATENT DOCUMENTS

| 5,189,136 A | 2/1993 | Wudl et al. |
| 5,331,183 A | 7/1994 | Sariftci et al. |
| 6,322,901 B1 | 11/2001 | Bawendi et al. |
| 6,878,871 B2 | 4/2005 | Scher et al. |
| 2001/0028055 A1 | 10/2001 | Fafard et al. |
| 2001/0046244 A1 | 11/2001 | Klimov et al. |
| 2002/0092987 A1 | 7/2002 | Cho et al. |
| 2003/0010987 A1 | 1/2003 | Banin et al. |
| 2003/0226498 A1* | 12/2003 | Alivisatos et al. ............. 117/84 |
| 2004/0023010 A1 | 2/2004 | Bulovic et al. |

(Continued)

FOREIGN PATENT DOCUMENTS

WO    WO 2004/049522 A2    6/2004

(Continued)

OTHER PUBLICATIONS

U.S. Appl. No. 60/650,476, filed Feb. 7, 2005, Drndic et al.

(Continued)

*Primary Examiner*—Mark Kopec
*Assistant Examiner*—Jaison P Thomas
(74) *Attorney, Agent, or Firm*—Woodcock Washburn, LLP

(57) ABSTRACT

Disclosed are compositions including semiconducting polymers and quantum dot nanocrystals. Also disclosed are optoelectronic devices prepared from semiconducting polymers and quantum dot nanocrystals. Also are disclosed methods of increasing the quantum efficiency in optoelectronic devices and methods of generating a photocurrent.

14 Claims, 9 Drawing Sheets

U.S. PATENT DOCUMENTS

| | | | |
|---|---|---|---|
| 2004/0084080 A1 | 5/2004 | Sager et al. | |
| 2004/0091710 A1 | 5/2004 | Bawendi et al. | |
| 2004/0118448 A1 | 6/2004 | Scher et al. | |
| 2004/0178390 A1 | 9/2004 | Whiteford et al. | |
| 2004/0187917 A1 | 9/2004 | Pichler | |
| 2004/0259363 A1 | 12/2004 | Bawendi et al. | |
| 2005/0002635 A1 | 1/2005 | Banin et al. | |
| 2005/0020923 A1 | 1/2005 | Frangioni et al. | |
| 2005/0117868 A1* | 6/2005 | Chen et al. | 385/143 |
| 2006/0128845 A1* | 6/2006 | Emrick et al. | 524/115 |
| 2007/0102694 A1 | 5/2007 | Drndic et al. | |

FOREIGN PATENT DOCUMENTS

| | | |
|---|---|---|
| WO | WO 2004/078027 A2 | 9/2004 |

OTHER PUBLICATIONS

U.S. Appl. No. 60/667,935, filed Apr. 4, 2005, Drndic et al.

"Quantum dots and ultra-efficient solar cells?", Institute of Science in Society, ISIS Press Release, 2006, http://www.i-sis.org.uk/QDAUESC.php, downloaded from the internet on Feb. 6, 2006, 4 pages.

"Quantum dots enables new advances in solar cell industry", Photovoltaics, http:/www.evidenttech.com/applications/quantum-dot-solar-cells.php, downloaded from the internet on Mar. 17, 2005, 3 pages.

Bakueva et al., "Size-tunable infrared (1000-1600nm) electroluminescence from PbS quantum-dot nanocrystals in a semiconducting polymer", Appl. Phys. Lett., Apr. 2003, 82(17), 2895-2897.

Bozano et al., "Temperature- and field-dependent electron and hole mobilities in polymer light-emitting diodes", Appl. Phys. Lett., Feb. 22, 1999, 74(8), 1132-1134.

Chang et al., "Efficient excitation transfer from polymer to nanocrystals", Appl. Phys. Lett, May 2004, 84(21), 4295-4297.

Chaudhary et al., "Trilayer hybrid polymer-quantum dot light-emitting diodes", Appl. Phys. Letts., Apr. 2004, 84(15), 2925-2927.

Coe-Sullivan et al., "Tuning the performance of hybrid organic/inorganic quantum dot light-emitting emitting devices", Organic Electronics, Sep. 2003, 4(2-3), 123-130.

Credo et al., "External quantum efficiency of single porous silicon nanoparticles", Appl. Phys. Letts., Apr. 5, 1999, 74(14), 1978-1980.

Ellingson et al., "Highly efficient multiple exciton generation in colloidal PbSe and PbS quantum dots", Am. Chem. Soc. 2005, 5(5), 865-871, http://pubs.acs.org/cgi-bin/abstract.cgi/nalefd/2005/5/io5/abs/nl0502672.html, downloaded from the internet on Feb. 6, 2005, Abstract, 1 page.

Gorer et al., "Quantum size effects in chemically deposited, nanocrystalline lead selenide films", J. Phys. Chem., Nov. 1995, 99(44), 16442-16448.

Hagler et al., "Polarized-electroabsorption spectroscopy of a soluble derivative of poly (p-phenylenevinylene) oriented by gel processing in polyethylene: polarization anisotropy, the off-axis dipole moment, and excited-state delocalization", Phys. Rev. B, Apr. 15, 1994, 49(16), 10968-10975.

Hikmet, "Study of conduction mechanism and electroluminescence in CdSe/ZnS quantum dot composites", J. of Appl. Phys., Mar. 2003, 93(6), 3509-3514.

Huynh et al., "Charge transport in hybrid nanorod-polymer composite photovoltaic cells", Phys. Rev. B., Mar. 24, 2003, 67(11), Art. No. 115326, 1-12.

Huynh et al., "Controlling the morphology of nanocrystal-polymer composites for solar cells", Advanced Functional Mat., Jan. 30, 2003, 13(1), 73-79.

Jiang et al., "Abstract G24.00009: Photovoltaic responses of solar cells based on lead selenide quantum dots and conducting polymers", APS Meeting, 2006, http://meetings.aps.org/Meeting/MAR06/Event/40813m downloaded from the internet on Jun. 5, 2006.

Kalaugher, "Nanoparticles boost solar cells", http://www.nanotechweb.org/articles/news/4/10/13/1, downloaded from the internet on Oct. 25, 2005, 2 pages.

Kelly, "Nano paint could boost antiterrorism, rescue efforts; New technology may be used to detect cancer in the first cells to become malignant", UofT university of Toronto, 2005, http://www.news.utoronto.ca/bin6/print/050125-899.htm, downloaded from the internet on Jan. 28, 2005, 2 pages.

Kucur et al., "Charge transfer efficiency in hybrid bulk heterojunction composites", J. of Chem. Phys., Jul. 8, 2004, 121(2), 1074-1079.

Kumar et al., "First solar cells based on CdTe nanoparticle/MEH-PPV composites", J. Mater. Res., Jul. 2004, 19(7), 1990-1994.

L'Abbé, "Nanotechnologists new plastic can see in the dark", EurekAlert, 2005, http://64.233.161.104/search?q=cache:vxcLr016yHYJ:www.eurekalert.org/pub_2005-1, downloaded from the internet on Jan. 21, 2005, 2 pages.

Laser Beam Measurement, "Understanding photodiode detector performance", Miles Griot, The Practical Application of Light, http://beammeasurement.mellesgriot.com/tut_photo_det.asp, downloaded from the internet on Dec. 8, 2004, 7 pages.

Liu et al., "Employing end-functional polythiophene to control the morphology of nanocrystal-polymer composites in hybrid solar cells", J. Am. Chem. Soc., May 7, 2004, 126(21), 6550-6551.

Lovgren, "Spray-on solar-power cells are true breakthrough", National Geographic News, 2005, http://news,nationalgeographic.com/news/2005/01/0114_solarplastic.html, downloaded from the interned on Jan. 21, 2005, 2 pages.

Machlis, "New nanomaterial could make way for fast, cheap optical components", Rational Investor's Guide to Nano and Micro Technology, 2002, http://www.smalltimes.org/print_doc.cfm?doc_id=3173, downloaded from the internet on Jan. 31, 2005, 2 pages.

Mae-Wan Ho, "Quantum dots and ultra-efficient solar cells?", ISIS Press Release Jan. 19, 2006, 4 pages.

McDonald et al., "New solution for infrared solar cells", Materialstoday, Mar. 2005, p. 10.

McDonald et al., "Photoconductivity from PbS-nanocrystal/semiconducting polymer composites for solution-processible, quantum-size tunable infrared photodetectors", Appl. Phys. Letts., Sep. 2004, 85(11), 2089-2091.

McDonald et al., "Solution-processed PbS quantum dot infrared photodetectors and photovoltaics", Letters, Jan. 9, 2005, 1-6.

Miranda et al., "Excitation spectrum for ultrafast photogeneration of charged solutions in polyacetylene", Phys. Rev., Sep. 10, 2002, 66(12), 125202-1-125202-5.

Novak, "Plastic LEDs break telecommunications barrier", American Technion Society, 2002, http://www.ats.org/news.php?id-39, downloaded from the internet on Jan. 31, 2005.

Nozik, "Quantum dot solar cells", Physica E-Low-Dimensional Systems & Nanostructures, Apr. 2002, 14(1-2), 115-120.

Nozik, "Spectroscopy and hot electron relaxation dynamics in semiconductor quantum wells and quantum dots", Annu. Rev. Phys. Chem., Oct. 2001, 52, 193-231.

Pientka et al., "Photogeneration of charge carriers in blends of conjugated polymers and semiconducting nanoparticles", Thin Solid Films, Mar. 22, 2004, (451-452), 48-53.

Pientka et al., "Photoinduced charge transfer in composites of conjugated polymers and semiconductor nanocrystals", Nanotechnology, Jan. 2004, 15(1), 163-170.

Sargent, "Infrared quantum dots", Adv. Mater., Mar. 3, 2005, 17(5), 515-522.

Schaller et al., "High efficiency carrier multiplication in PbSe nanocrystals: implications for solar energy conversion", Phys. Rev. Lett., May 5, 2004, 92(18), 186601-1-186601-4.

Steckel et al., "1.3 μm to 1.55 μm tunable electroluminescence from PbSe quantum dots embedded within an organic device", Adv. Mater., Nov. 4, 2003, 15(21), 1862-1866.

Suh et al., "Observation of the photorefractive behaviors in the polymer nanocomposit based on p-PMEH-PPV/CdSe-nanoparticle matrix", Opt. Mater., Jan. 2003, 21(1-3), 365-371.

Talapin et al., "Synthesis of surface-modified colloidal semiconductor nanocrystals and study of photoinduced charge separation and transport in nanocrystal-polymer composites", Physica E-Low-Dimensional Systems & Nanostructures, Apr. 2002, 14(1-2), 237-241.

Watt et al., "A new approach to the synthesis of nanocrystal conjugated polymer composites", 2004, International Conference on Synthetic Metals, submitted to Synthetic Metals, Sep. 22, 2005, 154(1-3), 57-60.

Watt et al., "Lead sulphide nanocrystal: conducting polymer solar cells", Citebase, Aug. 2, 2004, 21 pages.

Watt et al., "Nanocrystal conducting polymer photovoltaics", http://www.physics.uq.edu.au/people/watt/research.html, downloaded from the internet on Feb. 11, 2005, 6 pages.

Weiss et al., "Quantum-dot leap: Tapping tiny crystals' inexplicable light-harvesting talent", Science News, Jun. 3, 2006, 169(22), 344-345.

Xu et al., "An investigation on the potential applications of near infrared PbSe nanocrystal quantum dots in photovoltaic cells", 208th ECS Meeting, Los Angeles, CA, Oct. 20, 2005, 5 pages.

* cited by examiner

# POLYMER-NANOCRYSTAL QUANTUM DOT COMPOSITES AND OPTOELECTRONIC DEVICES

CROSS REFERENCE TO RELATED APPLICATIONS

This application claims the benefit of U.S. patent application Ser. No. 11/348,039, filed Feb. 6, 2006, which claims the benefit of U.S. Provisional Application No. 60/650,476, filed Feb. 7, 2005, and the benefit of U.S. Provisional Application No. 60/667,935, filed Apr. 4, 2005, the entirety of each of these being incorporated by reference herein.

STATEMENT OF GOVERNMENT RIGHTS

The invention was made with U.S. Government support. The Government may have certain rights in the invention under Office of Naval Research Grant No. N000140410489.

FIELD OF THE INVENTION

The field of the invention pertains to composite materials of quantum dots and polymers. The field of the invention also pertains to optoelectronic devices, for example, photodetectors and photovoltaic cells.

BACKGROUND OF THE INVENTION

Conjugated polymers and nanocrystal quantum dots ("QDs") have attracted the attention of researchers for the development of novel optoelectronic devices, such as light emitting diodes ("LEDs"), photovoltaics, and optical information memory. The tunable band gap of QDs makes them attractive for tailoring the visible and infrared absorption and emission of the light-sensitive layer of optoelectronic devices. Both conjugated polymers and nanocrystals are promising candidates for novel optoelectronic devices also because of their simple chemical syntheses and the easy processing methods such as spin-coating or doctor-blading.

Optoelectronic devices made of pure poly[2-methoxy-5-(2'-ethylhexyloxy)-1,4-phenylenevinylene] ("MEH-PPV"), such as those disclosed in U.S. Pat. No. 5,189,136 to Wudl and Srdanov, have limited quantum efficiencies due to a low electron and hole mobility compared to those of inorganic materials, L. Bozano, et al., *Appl. Phys. Lett.*, 74, 1132 (1999). J. S. Steckel, et al., disclose infrared electroluminescent devices having colloidally grown PbSe quantum dots (QDs) in organic host materials. The electroluminescence is tuned from a wavelength ($\lambda$, lambda) of 1.33 microns (1330 nm) to 1.56 microns (1560 nm) by changing the quantum dot size. U.S. Pat. App. Pub. No. 2005/0002635 discloses a composite material comprising a host material in which are incorporated semiconductor nanocrystals.

Accordingly, there is a continuing need to prepare optoelectronic materials for use in optoelectronic devices, such as light emitting diodes, photovoltaic cells, lasers and photodetectors. In particular, there is a continuing need to develop optoelectronic materials having quantum efficiencies greater than 1.

SUMMARY OF THE INVENTION

The present invention provides composite materials composed of a semiconducting polymer, such as poly[2-methoxy-5-(2'-ethylhexyloxy)-1,4-phenylenevinylene] ("MEH-PPV"), and PbSe nanocrystal quantum dots. These composite materials are useful in preparing optoelectronic devices, such as light emitting diodes, photovoltaic cells, lasers and photodetectors.

The present invention provides compositions, comprising a semiconducting polymer characterized as having an optical bandgap in the visible part of the electromagnetic spectrum, and a plurality of nanocrystals characterized as having a bandgap in the infrared part of the electromagnetic spectrum, wherein the weight ratio of semiconducting polymer to nanocrystals is in the range of from about 1:100 to about 1000:1.

The present invention also provides methods of increasing the external quantum efficiency of an optoelectronic device comprising a semiconductor polymer characterized as having a bandgap in the visible portion of the electromagnetic spectrum, comprising the step of:

combining nanocrystals with the semiconductor polymer, wherein the nanocrystals have a bandgap in the infrared portion of the electromagnetic spectrum, and the weight ratio of semiconductor polymer to nanocrystals is in the range of from about 1:100 to about 1000:1.

The present invention further provides optoelectronic devices, comprising two electrodes; and an optically active composition situated between the electrodes, wherein the optically active composition comprises a semiconducting polymer characterized as having a bandgap in the visible part of the electromagnetic spectrum, and a plurality of nanocrystals characterized as having a bandgap in the infrared part of the electromagnetic spectrum, wherein the weight ratio of semiconducting polymer to nanocrystals is in the range of from about 1:100 to about 1000:1.

The present invention also provides methods of generating a photocurrent, comprising: providing two or more electrodes, at least one of the electrodes capable of being at least partially optically transparent, and providing an electro-optically active composition situated between the electrodes, wherein the electro-optically active composition comprises a semiconducting polymer characterized as having a bandgap in the visible part of the electromagnetic spectrum, and a plurality of nanocrystals characterized as having a bandgap in the infrared part of the electromagnet spectrum, wherein the weight ration of semiconducting polymer to nanocrystals is in the range of from about 1:100 to about 1000:1; applying a reverse bias voltage to the electrodes; and illuminating the electro-optically active composition with light to generate the photocurrent.

The present invention also provides photodetectors having an external quantum efficiency greater than 1 for electric fields of about E~7×10$^5$ V/cm. These photodetectors are based on composites of a semiconducting polymer, such as poly[2-methoxy-5-(2'-ethylhexyloxy)-1,4-phenylenevinylene] ("MEH-PPV"), and PbSe nanocrystal quantum dots, wherein the PbSe nanocrystal bandgap is at least three times larger than the energy gap of the semiconducting polymer.

Other aspects of the present invention will be apparent to those skilled in the art in view of the detailed description and drawings of the invention as provided herein.

BRIEF DESCRIPTION OF THE DRAWINGS

The foregoing summary, as well as the following detailed description, is further understood when read in conjunction with the appended drawings. For the purpose of illustrating the invention, there is shown in the drawings exemplary embodiments of the invention; however, the invention is not limited to the specific methods, compositions, and devices disclosed. In the drawings.

DETAILED DESCRIPTION OF ILLUSTRATIVE EMBODIMENTS

Figure 1:
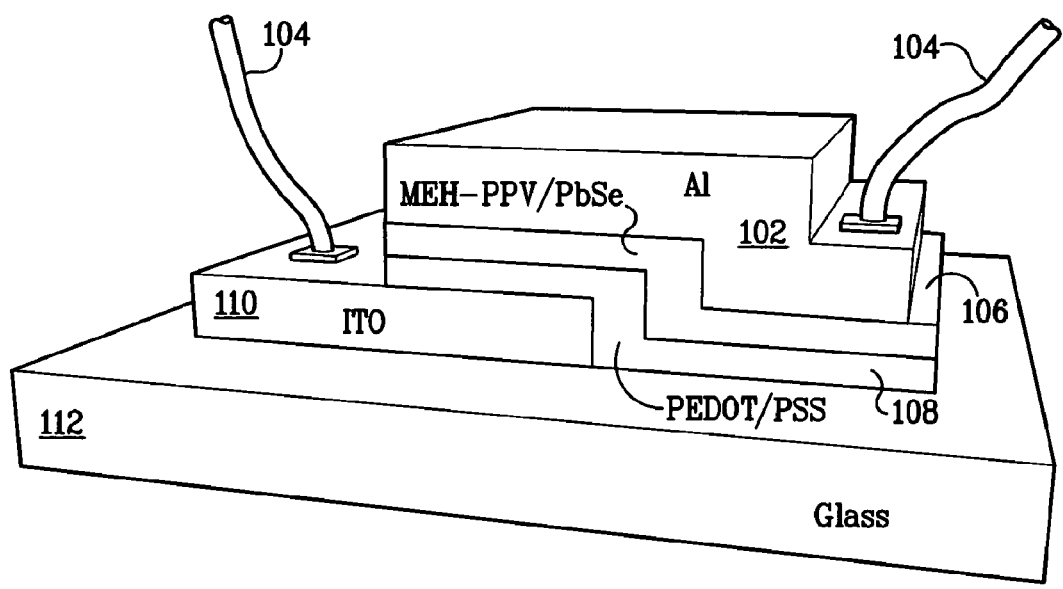
FIG. 1 is a schematic layout of an embodiment of the present invention, an ITO/PEDOT:PSS/MEH-PPV:PbSe/Al photodetector on a glass substrate.

The present invention may be understood more readily by reference to the following detailed description of the invention taken in connection with the accompanying figures and examples, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable. When any variable occurs more than one time in any constituent or in any formula, its definition in each occurrence is independent of its definition at every other occurrence. Combinations of substituents and/or variables are permissible only if such combinations result in stable compounds.

As employed above and throughout the disclosure, the following terms, unless otherwise indicated, shall be understood to have the following meanings.

As used herein, the term "photogeneration" means the excitation of an electron into the conduction band ("CB") by the absorption of a photon.

As used herein, the term "composite" means a composition of two or more different materials, for example, polymers and quantum dots.

As used herein, the term "excitation" means the process by which the energetic state of the material is changed using means such as light.

As used herein, the term "absorption" means the ability or the process by which the material to absorb some or all of the incoming light energy.

As used herein, the term "photodetector" means a device which can convert a light signal into an electrical signal.

As used herein, the term "electrical signal" can be a resistance, a current, a voltage, a change in resistance, a change in current, or a change in voltage, or any combination thereof.

As used herein, the term "photodiode" means a material or device which converts light into electrical current.

As used herein, the term "photocurrent" means the current that flows through a photosensitive device, such as a photodetector, as the result of exposure to radiant power. The photocurrent may occur as a result of a photoelectric, photoemissive, or photovoltaic effect.

As used herein, the term "quantum efficiency" refers to the probability of a quantum device, such as a photodetector, of generating a charge. Each incoming photon typically generates either one or zero units of electron charge to contribute to the photocurrent. Quantum efficiency mainly depends on how efficiently charge carriers are swept across a junction. The overall quantum efficiency of the photodiode is often referred to as external quantum efficiency (EQE) or ($\eta$).

As used herein, the term "semiconducting polymer" means a polymer that conducts charge under certain ambient conditions such as temperature and light.

As used herein, the term "nanocrystal" means a cluster or collection of atoms forming a nanoscale crystal.

As used herein, the term "quantum dot" means a confined region of space where one or more electrons or holes can be located. Unless indicated otherwise, the terms "nanocrystal" and "quantum dot" are synonyms.

As used herein, the term "external quantum efficiency" means the efficiency of the device to produce electrons, that is, it is the ratio between the number of electrons produced per photon.

As used herein, the term "photocurrent gain" means that the external quantum efficiency is greater than one, that is, more than one electron is generated per photon.

As used herein, the term "carrier multiplication" means that the initial carriers such as electrons and holes are creating new carriers (electrons and holes) by transferring some of their energy to these new carriers.

As used herein, the term "multiple exciton generation" means generation of one of more pairs of electrons and holes.

As used herein, the term "charge conduction" means the ability of a material to conduct charge.

As used herein, the term "host polymer material" means the polymer material of a composite material.

As used herein, the term "bandgap" means the energy gap separating the energy levels (or values) that do not participate in conduction and those that do participate in conduction. Unless indicated otherwise, the terms "bandgap" and "energy gap" are synonyms.

As used herein, the term "active polymer material" means a polymer material that responds to excitation.

The present invention provides composite materials composed of a semiconducting polymer and nanocrystals, for example, PbSe quantum dot ("QD") nanocrystals. The composite materials of the present invention are useful in preparing optoelectronic devices, such as light emitting diodes, photovoltaic cells, lasers and photodetectors. Suitable compositions of the semiconducting polymer and the nanocrystals can be prepared using any of a variety of techniques, examples of which include solution blending, melt blending, and powder blending. Preferably, the compositions of the present invention are prepared by mixing the semiconducting polymer, which is dissolved in a suitable solvent, with nanocrystals. Preferably, the nanocrystals are at least partially soluble in the same or similar solvent the that semiconductive polymer is dissolved in. Suitable films of the semiconducting polymer and the nanocrystals can be prepared using any of a number of film forming techniques known in the art, for example, spin coating, doctor blade coating, web coating, gravure coating, microgravure coating, ink jet printing, and spray coating. After coating, the solvent is typically removed by evaporation.

The weight ratio of semiconducting polymer to nanocrystals can be in the range of from about 1:100 to about 1000:1, or from about 1:10 to about 1000:1, or from about 1:1 to about 100:1, or from about 5:1 to about 20:1, or any combination thereof.

Suitable nanocrystals used in the present invention are commercially available from Evident Technologies, Troy, N.Y. Suitable nanocrystals useful in various embodiments of the present invention range in size from about 1 nm to about 10 nm in diameter, and typically from about 2 nm to about 8 nm in diameter. Blends of different sizes of nanocrystals may also be used, for example for tailoring the absorbance and emission spectrum of an optoelectronic device. Suitable PbSe nanocrystals may have a core-shell structure composed of a semiconducting core material and an optional semiconducting shell material. Preferably, the PbSe nanocrystals comprise substantially a core. Suitable nanocrystals also comprise one or more ligand molecules attached or adsorbed to the surface of the quantum dot. Suitable ligand molecules include organic moieties that give rise to a ligand layer, preferably an organic ligand layer, of from about 0.1 nm to 10 nm thick, typically from about 0.2 nm to about 5 nm thick, and more typically of from about 0.5 nm to about 3 nm thick. In certain preferred embodiments, the PbSe nanocrystals include surfactant fragments, such as oleic acid fragments, which preferably are about 1 nm to about 3 nm in length. In certain embodiments, the nanocrystals comprise PbSe, and in preferred embodiments, the nanocrystals consist essentially of PbSe.

Other nanocrystals may also be used in the present invention, many of which are described by Bawendi et al., in WO2004078027 A2, the description of which pertaining to the synthesis of nanocrystals is incorporated by reference herein. A suitable nanocrystal can be a member of a population of nanocrystals having a narrow size distribution. A suitable nanocrystal can be a sphere, rod, disk, or other shape. Spherical nanocrystals are preferred.

Suitable nanocrystals used in various embodiments include particles composed of a semiconductor material having a particle size in the range of from about 0.5 nm to about 20 nm, typically in the range of from about 1 nm to about 15 nm, more typically in the range of from about 2 nm to about 12 nm, and even more typically in the range of from about 3 nm to about 9 nm. In certain embodiments, suitable nanocrystals include a composition having the formula MX, where M is lead, tin, germanium, cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The semiconductor forming the nanocrystal can include Group II-VI compounds, Group II-V compounds, Group III-VI compounds, Group III-V compounds, Group IV-VI compounds, Group compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, IlAs, InSb, TIN, TIP, TlAs, TlSb, PbS, PbSe, PbTe, or mixtures thereof. Nanocrystals prepared from Group IV-VI (e.g., PbSe and InAs) are particularly suitable for providing nanocrystals that emit in the NIR spectrum, with PbSe being preferred.

In certain embodiments, the addition of nanocrystals, for example PbSe, to semiconductor polymers that are active in the visible spectrum, for example MEH-PPV, gives rise to an increase in the external quantum efficiency of photodiodes. For example, the external quantum efficiency can be increased by more than 50%, even by more than 100%, further by more than 200%, and even by more than 300%, compared to photodiodes prepared without the addition of PbSe nanocrystals to the semiconducting polymer. Without being bound by a particular theory of operation, it appears that the proximate location of the semiconductor polymer to the PbSe nanocrystals enhances quantum efficiency.

The emission from the nanocrystal can be a narrow Gaussian emission band that can be tuned through the complete wavelength range of infrared regions of the spectrum by varying the size of the nanocrystal, the composition of the nanocrystal, or both. For example, InAs and PbSe can be tuned in the infrared region.

The population of nanocrystals can have a narrow size distribution. The population can be monodisperse and can exhibit less than about 15% rms ("Root-Mean-Square") deviation in diameter of the nanocrystals, preferably less than about 10% rms, more preferably less than about 5% rms. In certain embodiments, the population of nanocrystals can be polydisperse, for example exhibiting a deviation in diameter of greater than about 15% rms, preferably greater than about 25% rms, and more preferably greater than about 35% rms. In certain embodiments, the size distribution can be bimodal, for example composed of a population of two narrow size distribution nanocrystals, trimodal, for example composed of a population of three narrow size distribution nanocrystals, or polymodal, for example composed of a population of n narrow size distribution nanocrystals, wherein n is 4 or greater.

Many suitable nanocrystals are commercially available, for example, from Evident Technologies, Troy, N.Y. The preparation of a wide variety of nanocrystals are also known to those skilled in the art. For example, U.S. Pat. No. 6,322,901 to Bawendi et al., incorporated herein by reference, discloses the synthesis of CdX/ZnY core/shell nanoparticles, where X is S, Se and Te, and Y is S and Se. These methods of preparing semiconductor nanocrystals include pyrolysis of organometallic reagents, such as dimethyl cadmium, injected into a hot, coordinating agent. This permits discrete nucleation and results in the controlled growth of macroscopic quantities of nanocrystals. Suitable nanocrystals can be synthesized using colloidal growth process and can produce a monodisperse particle population. Colloidal growth occurs by rapidly injecting an M donor and an X donor into a hot coordinating agent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature for maintaining steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be related to as a size. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or X donor, the growth period can be shortened.

Suitable nanocrystals typically emit light in the near infrared ("NIR") or infrared ("IR") wavelength regions when excited with incident radiation. An example of a semiconductor nanocrystal that emits light in the near an infrared or infrared wavelength regions is PbSe nanocrystals having a particle size in the range of from about 1 nm to about 10 nm.

Suitable semiconducting polymers include any of the known conjugated polymers and derivatives thereof. Preferably, the semiconducting polymers are active in the visible range. Suitable semiconducting polymers that are active in the visible range include: polyacetylene ("PA"), polyparaphenylene ("PPP"), polypyrrole ("PP"), polyparaphenylene sulfide ("PPS"), polythiophene ("PT"), poly(1,4-phenylenevinylene) ("PPV"), poly-3-methyl thiophene ("P3MT"), polycarbazole ("PCB"), polyisothianaphene ("PITN"), poly (1,6-heptadiyne) ("PHT"), poly(3-alkyl thiophene), where alkyl is $C_nH_{2n+1}$, for n=1 to 10, for example, poly(3-ethyl thiophene) ("P3ET") and poly(3-butyl thiophene) ("P3BT"), polyquinoline ("PQ"), poly(3-alkylsulfonate), where alkyl is $CH_2CH_2SO_3Na$ ("P3ETSNa") or $(CH_2)_4SO_3Na$ ("P3BTSNa"), polyaniline ("PANI"), as well as random copolymers, block copolymers, graft copolymers, blends, soluble derivatives, or any combinations thereof. A particularly suitable semiconducting polymer is a soluble derivative of PPV, preferably poly[2-methoxy-5-(2'-ethylhexyloxy)-1,4-phenylenevinylene] ("MEH-PPV"). Semiconducting polymers are commercially available, e.g., from the Sigma-Aldrich Company, www.sigmaaldrich.com.

The present invention also provides photodetectors having an external quantum efficiency greater than 1 for electric fields of about E~$7\times10^5$ V/cm. These photodetectors are based on composites of a semiconducting polymer, such as poly[2-methoxy-5-(2'-ethylhexyloxy)-1,4-phenylenevinylene] ("MEH-PPV"), and PbSe nanocrystal quantum dots. Without being bound by a particular theory of operation, the observed photocurrent gain may be attributed to the carrier multiplication in PbSe nanocrystal quantum dots via multiple exciton generation, and the efficient charge conduction through the host polymer material. This photocurrent gain is observed when the PbSe nanocrystal bandgap is at least three times larger than the energy gap of the active polymer material.

Lead sulfide ("PbS"), cadmium telluride ("CdTe"), and cadmium selenide ("CdSe") QDs have been investigated in LEDs and photovoltaic ("PV") cells (i.e., solar cells). Using photoluminescence measurements, T.-W. F. Chang, et al., *Appl. Phys. Lett.*, 84, 4295 (2004), reported efficient excitation transfer from a conducting polymer to PbS QDs. In comparison to CdSe or CdS, PbSe QDs show stronger quantum confinement due to their large exciton Bohr radius of ~40 nm and low effective hole and electron masses, as reported by S. Gorer, et al., *J. Phys. Chem.*, 99, 16442 (1995). The bandgap of PbSe QDs is tunable from ~0.5 eV to ~1.6 eV as the QD diameter is varied from 9 nm to 3 nm. Recently, Schaller et al., *Phys. Rev. Lett.*, 92, 186601-1 (2004), have demonstrated carrier multiplication in PbSe QDs by monitoring their transient absorption. According to A. J. Nozik, *Annu. Rev. Phys. Chem.*, 52, 193 (2001), these transient absorption results indicate that the photogeneration of multiple excitons can occur via impact ionization for pumping photon energies $\geq 3 \cdot Eg$, where Eg is the bandgap energy of PbSe QDs. For PbSe QDs with the absorption peak of ~1900 nm and diameter ~8 nm, this corresponds to excitation wavelengths smaller than ~630 nm, still in the visible range. However, for QD sizes <4.5 nm, corresponding to the absorption peak <1100 nm, carrier multiplication may occur for excitations having wavelengths lower than the visible range.

Suitable optoelectronic devices include two or more electrodes, and an electro-optically active composition situated between the electrodes. Suitable electrodes can be prepared from any electrically conductive material. At least one of the electrodes is characterized as being at least partially optically transparent. This feature permits light to pass through and create and exciton in the electro-optically active composition. The electro-optically active composition can include any of the aforementioned composite materials, e.g., a semiconducting polymer characterized as having a bandgap in the visible part of the electromagnetic spectrum, and a plurality of nanocrystals characterized as having a bandgap in the infrared part of the electromagnetic spectrum. Typically, the weight ratio of semiconducting polymer to nanocrystals is in the range of from about 1:100 to about 1000:1. The semiconducting polymer preferably comprises a soluble derivative of poly(1,4-phenylenevinylene), e.g., poly[2-methoxy-5-(2'-ethylhexyloxy)-1,4-phenylenevinylene]. The nanocrystals suitably comprise a Group IV-VI compound, preferably comprising PbSe, and consisting essentially of PbSe. The PbSe nanocrystals can have a particle size in the range of from about 1 nm to about 20 nm. Suitable PbSe nanocrystals comprise a plurality of surface ligands extending up to about 3 nm from the surface of the nanocrystals.

The optoelectronic device can be a photodiode, a photodetector, a photovoltaic cell, a light-emitting diode, a laser, or any combination thereof. The optoelectronic device is capable of absorbing or emitting visible light. Suitable optoelectronic devices are characterized has having the ratio of the energy of the radiation that is absorbed or emitted by the device to the bandgap energy of the nanocrystals being in the range of from about 2 to about 4, and preferably in the range of from about 2.5 to about 3.5. The weight ratio of semiconductor polymer to nanocrystals is preferably in the range of from about 5:1 to 20:1. Optoelectronic devices are typically characterized as having and external quantum efficiency that is greater than about 35 percent, and even greater than about 80 percent, when a reverse bias of about −5 volts is applied across the electrodes.

Methods of generating a photocurrent, such as for use in a photodetector, photovoltaic cell, solar cell, and the like, include providing an optoelectronic device as described herein, applying a reverse bias voltage to the electrodes, e.g., from −2 V to −10 V, and illuminating the electro-optically active composition with light to generate the photocurrent. For example, a suitable optoelectronic device for generating a photocurrent, includes two or more electrodes, at least one of the electrodes capable of being at least partially optically transparent, and providing an electro-optically active composition situated between the electrodes, wherein the electro-optically active composition comprises a semiconducting polymer characterized as having a bandgap in the visible part of the electromagnetic spectrum, and a plurality of nanocrystals characterized as having a bandgap in the infrared part of the electromagnet spectrum, wherein the weight ration of semiconducting polymer to nanocrystals is in the range of from about 1:100 to about 1000:1. Other characteristics and operating conditions of the devices are described further herein.

In other embodiments of the present invention, efficient polymer-nanocrystal quantum dot photodetectors for visible light based on a semiconducting polymer and QDs, with absorption in the visible and infrared ranges, respectively, have been prepared. By choosing a suitable size of QDs, the photoresponsivity spectrum of the composite devices can be tailored in the visible range.

EXAMPLES AND OTHER ILLUSTRATIVE EMBODIMENTS

Photodiodes composed of MEH-PPV and PbSe quantum dots were fabricated according to the procedures described herein. Additional fabrication details are provided below. The properties of efficient photodetectors based on the conducting polymer poly[2-methoxy-5-(2'-ethylhexyloxy)-1,4-phenylenevinylene] (MEH-PPV) and PbSe nanocrystal QDs are described herein. When PbSe QDs were dispersed in a polymer host having an absorption spectrum in the visible range, a dramatic enhancement of the quantum efficiency of the polymer-based photodetectors was observed. Photocurrents of several devices having different polymer-nanocrystal mixing ratios with polymer concentrations ranging from 50% to 100% of the total mass was measured. Two different sizes of PbSe QDs, one having an IR absorption peak at 1100 nm (1.13 eV) and QD diameter ~4.5 nm, and the second, having an absorption peak at 1900 nm (0.65 eV) and QD diameter ~8 nm. For excitation wavelengths from ~400 to 800 nm the quantum efficiencies greater than 1 (i.e., gain) were observed in devices with the larger PbSe QDs.

FIG. 1 shows the schematic diagram of the fabricated devices. The MEH-PPV/PbSe photodetectors were fabricated on 25 mm×25 mm glass substrates pre-coated with a 150-nm-thick layer of indium tin oxide (ITO). A 60-nm-thick layer of PEDOT/PSS (Poly(2,3-dihydrothieno(3,4-b)-1,4-dioxin/Poly(styrenesulfonate)) was spin-cast on the ITO substrate in order to improve the charge transport through the device. The active layer of the photodetector was also spin-cast from the MEH-PPV/PbSe mixed solution. The MEH-PPV, a soluble derivative of poly(p-phenylene vinylene) was used as a host for the PbSe QDs. PbSe QDs were capped with 2 nm-long oleic acid ligands. The MEH-PPV was dissolved in chlorobenzene and purified with a 5 nm syringe filter. The MEH-PPV and PbSe QDs were mixed to make films with 99.7% of total weight (w), 99% w, 97% w, 95% w, 90% w, 83% w, and 50% w of MEH-PPV. Another device with pure MEH-PPV was fabricated for comparison. The average thickness of polymer-nanocrystal blended films was about 60 nm, as measured by a stylus profilometer (Tencor Alpha Setup 500). The samples were stored in vacuum overnight to completely remove the residue solvent. Finally, an aluminum top electrode was fabricated using thermal evaporation through a shadow mask. The active area of the photodetector was about 0.07 cm² (~3 mm×2.3 mm).

Figure 2:
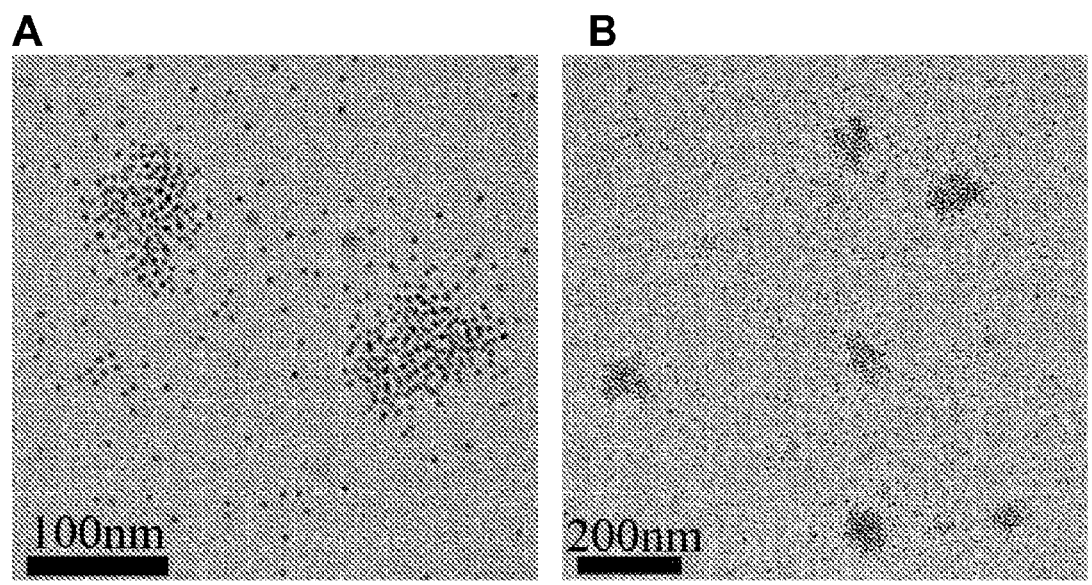
FIG. 2 depicts TEM images of a composite material of the present invention, PbSe QDs (1900 nm) in a MEH-PPV host (95% w of MEH-PPV). The scale bars in the left and right images are 100 nm and 200 nm, respectively. Some aggregation of QDs into non-ordered clusters is observed.

FIG. 2 shows the transmission electron microscope (TEM) images of PbSe QDs dispersed in MEH-PPV. The molecular weight of MEH-PPV (Mw=86,000) indicates that the average degree of polymerization of MEH-PPV is ~334, i.e., 334 units in one molecule backbone. One repeating unit of MEH-PPV is ~8 Å. The average molecular length of MEH-PPV is ~267 nm. The size of PbSe QDs is 8 nm and the absorption peak is at 1900 nm. The PbSe QDs were capped with a 2-nm-long oleic acid ligand to prevent aggregation and to provide a good dispersion of PbSe QDs in MEH-PPV host.

The current-voltage characteristics were measured in air with a picoammeter (Keithley 6487) remotely controlled via a GPIB interface (National Instrument). The samples were measured immediately after the external leads were attached to the electrodes using a silver paste. The sample degradation in air happens on timescales longer than the timescales of our measurements. The monochromatic light was generated with a monochromator (Thermo Oriel) coming from a 100 W tungsten lamp. The optical power was read with a multifunction optical power-meter (Spectra-Physics). The photocurrent densities of MEH-PPV/PbSe (1900 nm, 99.7% w, 99% w, 97% w, 95% w, 90% w, 83% w, and 50% w of MEH-PPV) photodetectors and a pure MEH-PPV device in the dark and under the illumination with 510 nm, 68 µW/cm² monochromatic light are given in FIG. 3. For the measured devices, the dark current was <10⁻⁷ A at reverse bias voltages 0>V>–8 V, i.e., 1 to 2 orders of magnitude lower than the photocurrent.

Figure 3:
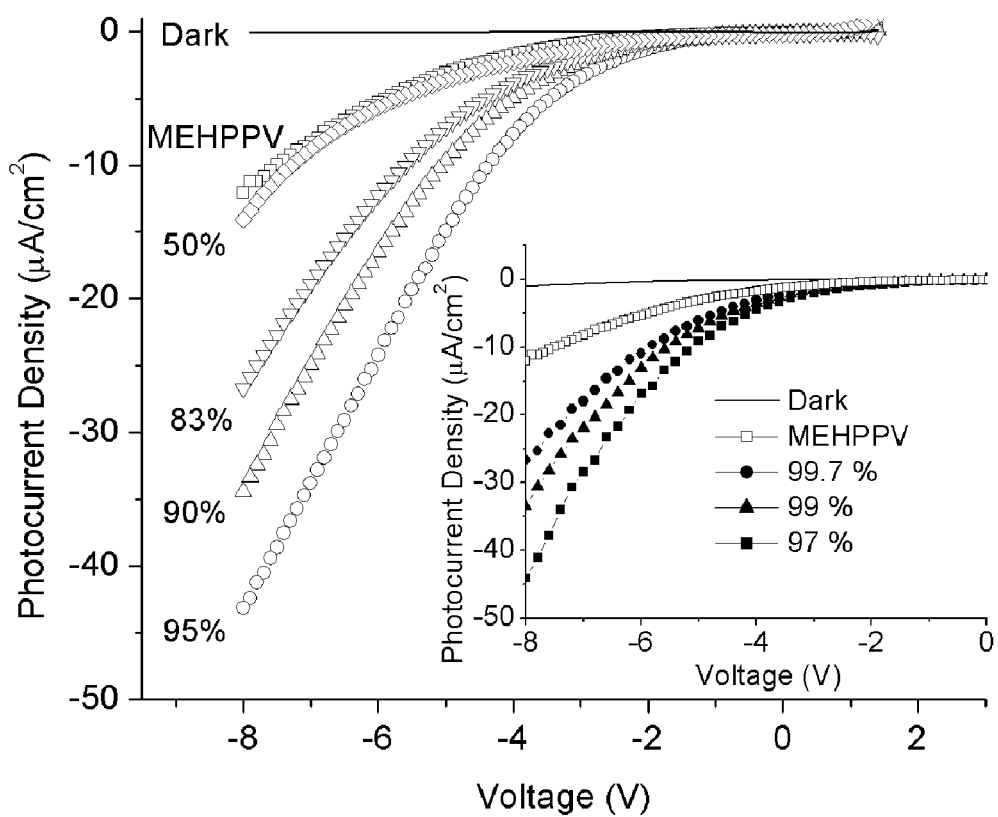
FIG. 3 depicts the photocurrent density of an embodiment of the present invention, a MEH-PPV/PbSe (1900 nm) photodetector with 95% wt (circles), 90% wt (upward triangles), 83% wt (downward triangles), 50% w of MEH-PPV (diamonds), and pure MEH-PPV (squares) under the illumination with 510 nm monochromator light with power density of 68 $\mu W/cm^2$. The dark current (solid line) for all devices is similar and $<10^{-7}$A. Inset: Photocurrent density for devices with 97% w (dark squares), 99% w (dark triangles), 99.7% w (dark circles), 100% w of MEH-PPV (open squares), and dark current (solid line).

FIG. 3 shows that there is a range of polymer weight in the mixture, around 95±2% w, for which the photocurrent is optimal. This corresponds to ~95% w of the polymer and ~5% w of the QDs. In contrast, the devices with ~50% w polymer and 100% w polymer show smaller photocurrents. When the amount of QDs is large (>50% w), the photoconduction through the film decreases. We have measured the photocurrent in pure PbSe QDs arrays separately, and it is several orders of magnitude lower than in the polymer-nanocrystal films. The presence of significant amounts of the conducting polymer appears to help the charge transport, while the photogeneration occurs in both the polymer and the QDs. We speculate that the concentration of QDs should be low enough to allow for many QDs to be well separated. FIG. 3 (inset) shows photocurrent for four devices from 97% w to 100% w of polymer. The photocurrent is largest for 97% and decreases as the polymer content is increased to 100%.

Figure 4:
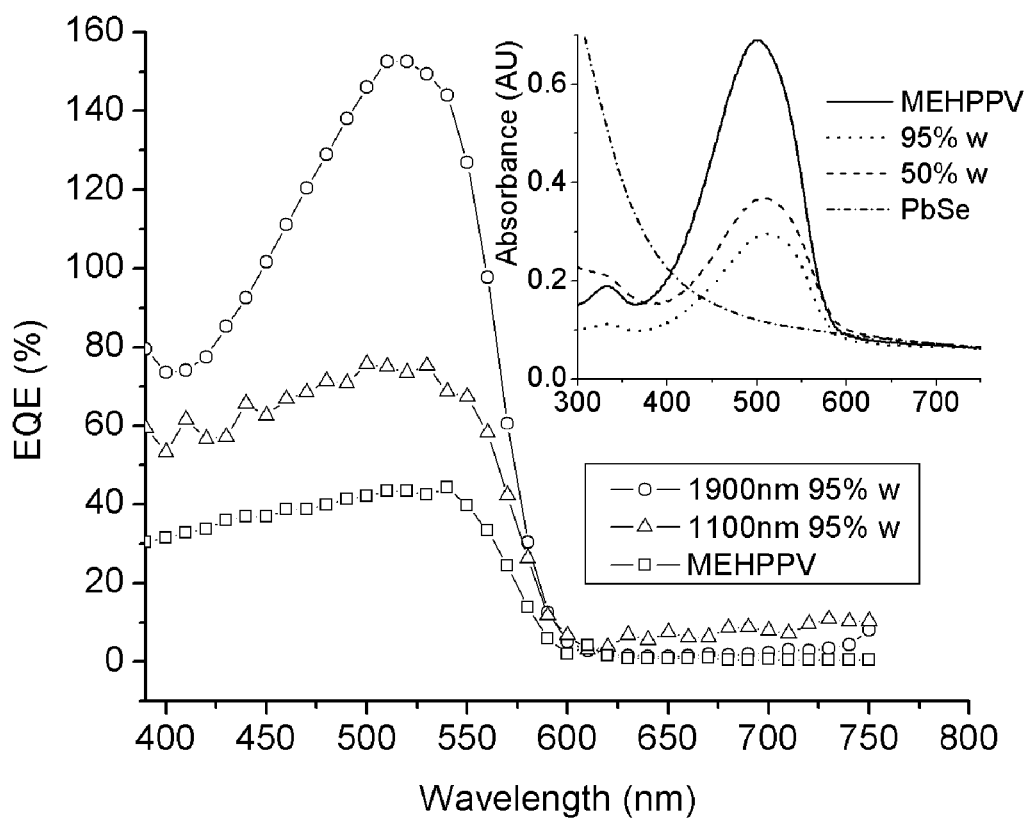
FIG. 4 compares the external quantum efficiencies of various photodetectors of the present invention prepared using MEH-PPV/PbSe QD composites of the present invention, operated at −8V: pure MEH-PPV (squares), MEH-PPV/PbSe (1100 nm) (triangles), and MEH-PPV/PbSe (1900 nm) (circles). Inset: UV/visible absorption spectrum of MEH-PPV:PbSe blended films on glass slides with 95 w (dots), 50% w (dashed line), pure MEH-PPV film (solid line), and PbSe QDs in solution (dash-dot line).

The external quantum efficiency (EQE) of a photodetector is defined as $$EQE = \frac{h \cdot c \cdot I}{e \cdot \lambda \cdot P},$$

where I is the photocurrent, P is the power of monochromatic light with wavelength λ, falling on the photodetector, h is Planck's constant, e is the electron charge, and c is the speed of light in vacuum. In FIG. 4 we show the EQEs of MEH-PPV/PbSe (1900 nm) and MEH-PPV/PbSe (1100 nm) composite photodetectors with the same polymer weight percentage (95 w), but two different QD diameters. The maximum EQE of the MEH-PPV/PbSe (1900 nm, 95% w of MEH-PPV) composite at –8V is ~150%, more than three times higher than the maximum EQE of a pure MEH-PPV device (see FIG. 4). The maximum EQE of the MEHPPV/PbSe (1900 nm, w of MEH-PPV) composite at –4V is 30%. The gain (i.e., EQE greater than 100%) at –8 V applied to the ITO electrode was observed in the devices with MEH-PPV/PbSe 99% w, 97% w, 95% w and 90% w of MEH-PPV, and not in devices with 99.7%, 83% w, and 50% w of polymer. It is assumed that in the MEH-PPV one photon generates only one exciton. If the photon energy is larger than the optical bandgap of the polymer, the excess energy will not contribute to generation of additional charge carriers. The EQE greater than 1 indicates that the gain could be due to the carrier multiplication via multiple excitons in PbSe QDs. In MEH-PPV/PbSe (1900 nm, 95% w of MEH-PPV) composite photodetectors the EQE reaches a maximum value of ~150% at 510 nm.

FIG. 4 (inset) shows the optical absorption of the pure MEH-PPV film, the MEH-PPV/PbSe QD blended films, and of the solution of the pure PbSe QDs measured with a UV-Visible Spectrophotometer (Agilent Technologies). The absorption peak of MEH-PPV is ~498 nm. The absorption peaks of all MEH-PPV/PbSe (1900 nm) composites are red-shifted to ~505 nm (shift of ~35 meV on energy scale), due to the presence of PbSe QDs.

In order to confirm that the observed photocurrent gain results from the appropriate choice of nanocrystal diameters, we have fabricated MEH-PPV/PbSe photodetectors with smaller PbSe QDs. For these devices, we used QDs with diameters ~4.5 nm, corresponding to the main absorption peak at ~1100 nm. Without being bound by a particular theory of operation, because the estimated onset energy for carrier multiplication in these QDs is ~2.38 eV or ~367 nm, the photocurrent is not expected to exist for the light excitations in the wavelength range from ~370 nm to ~800 nm. FIG. 4 shows the experimental results confirming that the efficiency is less than 100% for the MEH-PPV/PbSe (1100 nm, 95% w of MEH-PPV) composite photodetectors. Similar results were observed for devices with 90% w, and 83% w of the polymer. The EQE of all the devices (1100 nm) with the polymer weight percentage of 95% w, 90% w and 83% w is significantly less than 100%, and so no gain was observed.

Fabrication Details of Exemplary MEH-PPV and PbSe Quantum-Dot Photodiode Devices. Tables 1a and 1b provides information about the preparation of MEH-PPV:PbSe blended solutions that were used to make MEH-PPV/PbSe QD films. Films can generally be prepared having a thickness of from about 10 nm thick to about 100 nm thick, more typically from about 20 nm thick to about 80 nm thick, and even more typically of from about 30 nm thick to about 70 nm thick. Table 2 provides a summary on the thickness of the MEH-PPV/PbSe QDs films that were made.

Figure 5:
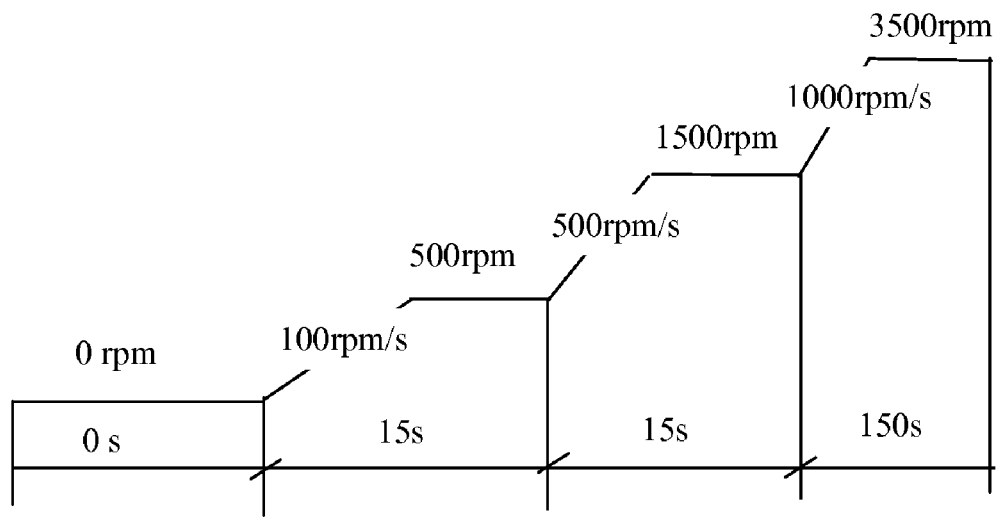
FIG. 5 shows a photoresist spin coating program used in preparing devices of the present invention.

Patterning ITO. An ITO-coated glass substrate was first flushed with acetone and then with isopropanol (IPA), spin-cast photoresist (PR) 1813 (purchased from Rohm and Haas Electronic Materials LLC) at final speed of 3500 rpm for 150 s shown in FIG. 5, pre-baked at 115° C. for 90 seconds on a hot plate, exposed photoresist at UV light for 18 s, developed the photoresist in Developer 319 (purchased from Rohm and Haas Electronic Materials LLC) for about 30 s, post-baked the substrate at 115° C. for 90 seconds on the hot plate, etched exposed ITO in 20% HCl solution in water at 100° C. for 4-5 min, flushed the substrates with D.I water, and used acetone to remove the remaining PR, cleaned the substrate with D.I water, Acetone, and then IPA.

Figure 6:
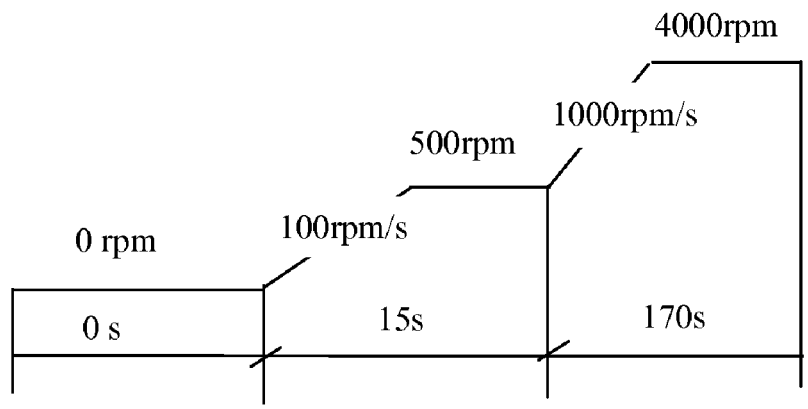
FIG. 6 shows a PEDOT:PSS spin coating program used in preparing devices of the present invention.

PEDOT:PSS Layer. PEDOT: PSS (Sigma Aldrich) was spincast at final speed of 4000 rpm for 170 seconds, as shown in FIG. 6. The PEDOT: PSS films were dried on a hot plane at 100° C. for half an hour and cooled down naturally, as annealing process. The thickness of the PEDOT: PSS film was around 60 nm using a profilometer.

Figure 7:
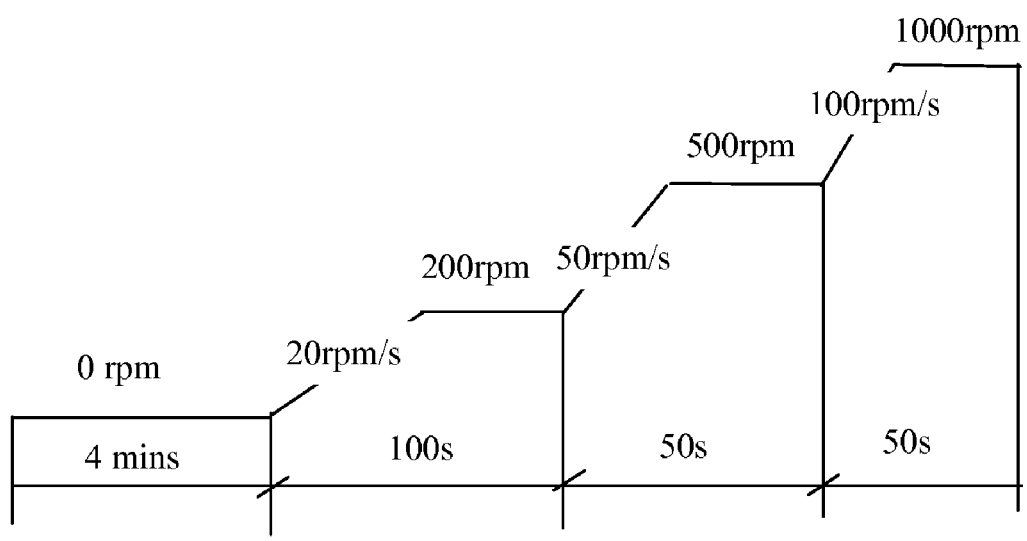
FIG. 7 shows a MEH-PPV/PbSe blend spin coating program used in preparing devices of the present invention.

Light-sensitive layer. MEH-PPV:PbSe blended solutions were prepared according to the formulations in Tables 1a and 1b. Because the PbSe solution had a relatively low concentration, the concentration for the blended solution with 50% w of MEH-PPV was not high. In order to keep all mixed solutions with the similar MEH-PPV concentration, extra solvent (chlorobenzene) was added for specific weight ratio. The final concentration of MEH-PPV was around 1.5-1.9 mg/ml. This concentration was apparently too low for regular spinning speed, so the solution was allowed to remain on the substrate for 4 minutes evaporate a portion of the solvent. The spincasting program for the blended solution is shown in FIG. 7. The same spin-casting process was used to deposit polymer blend layer on a cleaned glass substrate for UV/VIS absorption measurements.

Evaporating Al through shadow masks. Silicon shadow masks were etched from $SiO_2$-coated silicon substrates using Inductive Coupled Plasma (ICP). The four corners of the shadow mask were used as alignment marks. The thickness of Al was around 100 nm. The evaporation was done in $10^{-6}$ Torr vacuum. The active areas of devices after diode characterization was typically measured using a monochromator system for precise current density calculation.

Figure 8:
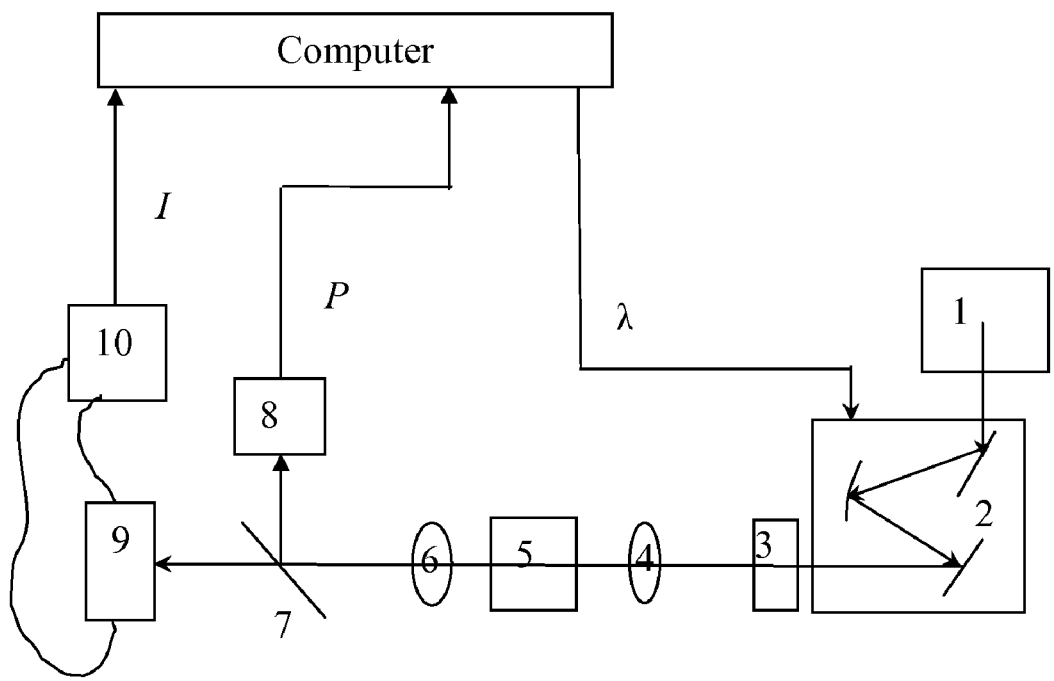
FIG. 8 is a schematic illustration of an experimental testing setup for testing embodiments of the photodetectors of the present invention.

Characterization and testing for MEH-PPV/PbSe QD photodetectors. Testing setup: Illustrated in FIG. 8 is a layout of an experimental testing setup used for MEH-PPV/PbSe photodetectors. 1 is a 100 W tungsten bulb; 2 is a monochromator (Oriel Corner ¼m Stone); 3 is a diffusion sphere; 4 and 6 are convex lenses; 5 is an optical chopper (optional); 7 is a beam-splitter 50%/50%; 8 is an optical power meter; 9 is a device under test; and 10 is a picoammeter (Keithley Model 6487). The optical chopper is optional if AC measurement is wanted. The optical chopper modulated the light into light pulses. The diffusion sphere was used to produce the uniform light beam. The Keithley 6487 was used to provide required voltage supply and measure the low-noise electrical current. The equipment was remotely controlled by computer via a NI GPIB board. The monochromator was used to provide a monochromatic light with a certain wavelength. The monochromator was also remotely controlled by computer via NI GPIB board. The optical power meter measures the power of incidence light and was remotely controlled by computer via a NI GPIB board.

Figure 9:
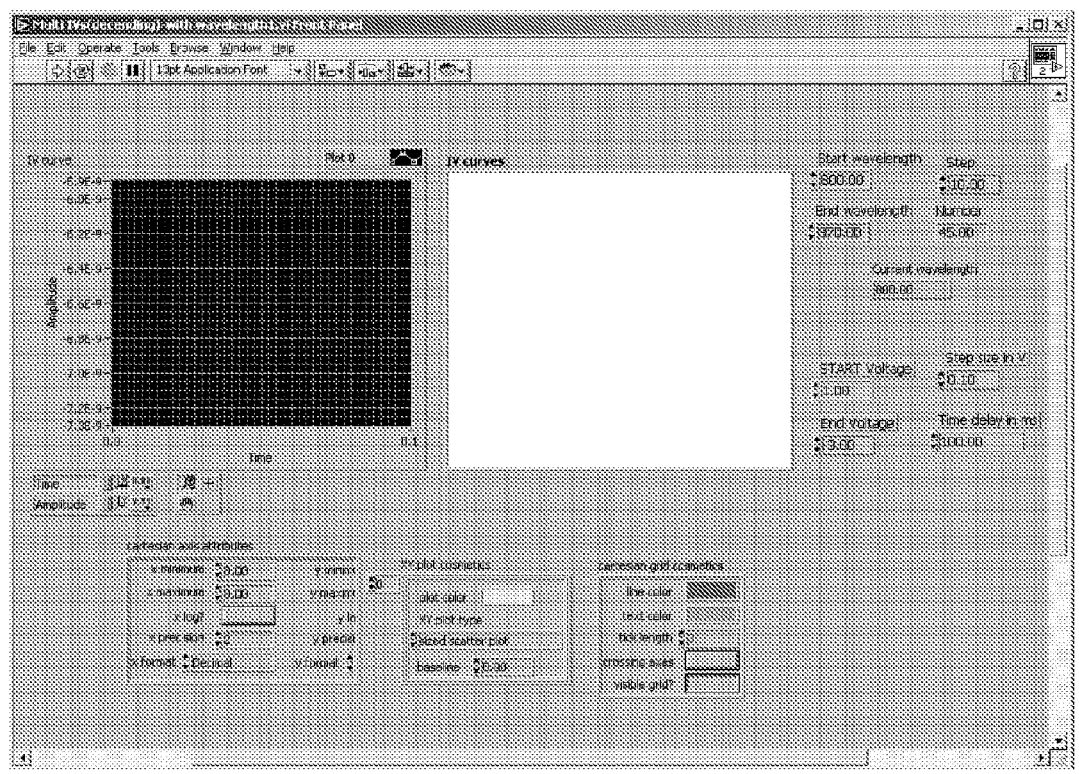
FIG. 9 is a front panel view of a Labview subroutine for analyzing current-voltage characteristic measurements of embodiments of the invention.
Figure 10:
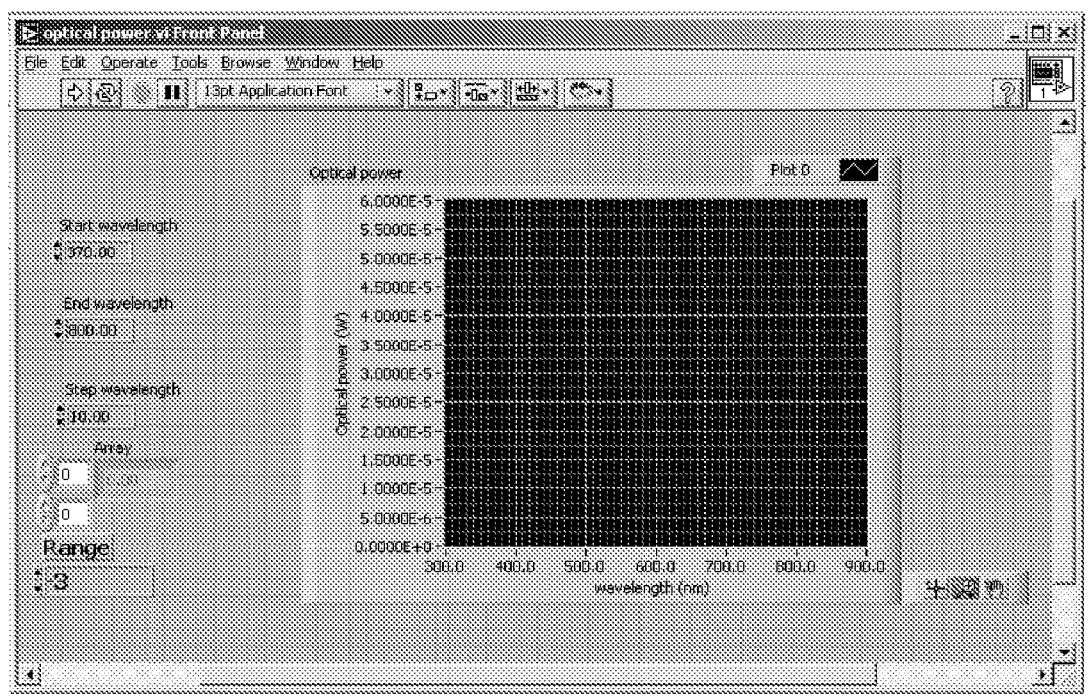
FIG. 10 is a front panel view of a Labview subroutine for analyzing the measurement of optical power at different wavelengths of embodiments of the invention.

Testing. Testing conditions: A customized Labview™ subroutine was developed for measuring and analyzing the current-voltage characteristics of various opt-electronic devices. The front panel of this routine is shown in FIG. 9. The optical power was obtained with another labview routine which front panel is shown in FIG. 10. Testing conditions: Room temperature in the air. The start wavelength (nm): 800 nm. The end wavelength (nm): 370 nm. The wavelength step (nm): 10 nm. The start voltage (V): 1. The end voltage (V): variable. The step voltage (V): 0.1. The time delay (ms): 100. FIG. 9 shows the Labview subroutine for current-voltage characteristic measurement—front panel. FIG. 10 shows the Labview subroutine for the measurement of optical power at different wavelength-front panel.

Test methods. (1) The end voltage was set to −3V; the light shutter of the monochromator was turned on; the sweep voltage was set to the range of from 1V to −3V for each wavelength to obtain about 44 current-voltage ("IV") curves when illuminated; the light shutter is subsequently turned off, and the sweep voltage set to the range of from 1V to −3V to obtain the IV curve when dark. (2) The end voltage was subsequently increased to −5V and step (1) was repeated. (3) The end voltage was increased to −8V and step (1) was repeated. (4) A computer program (shown in FIG. 10) is run to measure the optical power of the devices from 800 nm to 370 nm in steps of 10 nm. This program can used for calculating light power density. The light power density is defined as the optical power divided by the light beam area.

Data processing or calculations: The measurement data were collected using a computer, and the illuminated (light) and dark current-voltage points were stored in an electronic file. The EQE was calculated at a specific voltage and wavelength using Microsoft Excel: Photocurrent density=(Light current−Dark current)/Device area; EQE (%)=(124080*Photocurrent density)/(Light power density*Wavelength)

TABLE 1a

General information about MEH-PPV:PbSe blended solution preparation

|  | Solvent | Molecular weight | Concentration | Molecular conc. |
|---|---|---|---|---|
| PbSe | hexane | 86.18 | 1.25 mg/ml | 0.015 mol/L |
| MEH-PPV | chlorobenzene | 70,000-100,000 87,000(average) | 8 mg/ml | 0.00017 mol/L |

TABLE 1b

General information about MEH-PPV/PbSe blended solution preparation-continued.

| PbSe (mg) | PbSe solution volume (μl) | MEH-PPV mass (mg) | MEH-PPV solution volume (μl) | MEH-PPV:PbSe Weight ratio | Weight percentage of MEH-PPV | New concentration (MEH-PPV) | N0# | Added solvent (ml) |
|---|---|---|---|---|---|---|---|---|
| 0.125 | 100 | 2.5 | 310 | 20:1 | 95% | 1.5 mg/ml | #1 | 1.3 |
| 0.25 | 200 | 2.5 | 310 | 10:1 | 90% | 1.8 mg/ml | #2 | 0.9 |
| 0.375 | 300 | 1.875 | 240 | 5:1 | 83% | 1.7 mg/ml | #3 | 0.6 |
| 1 | 400 | 1 | 125 | 1:1 | 50% | 1.9 mg/ml | #4 | 0 |

PbSe concentration in Table 1 is the PbSe mass (mg) in unit volume (ml) of solvent.
MEH-PPV concentration in Table 1 is the MEH-PPV mass (mg) in unit volume (ml) of solvent.
New concentration means the MEH-PPV mass (mg) in the total mixture volume of PbSe solution and MEH-PPV solution.
PbSe solution has a relatively low concentration, the concentration for the blended solution with 50% w of MEH-PPV is not typically high. Extra solvent (chlorobenzene) was typically added for specific weight ratio to maintain similar MEH-PPV concentrations.

TABLE 2

Summary of MEH-PPV/PbSe QDs films

| Weight percentage of MEH-PPV in Film | Film Thickness (nm) |
|---|---|
| 50% | ~65 |
| 83% | ~60 |
| 90% | ~55 |
| 95% | ~45 |
| 100% | ~70 |

What is claimed:

1. A method of increasing the external quantum efficiency of an optoelectronic device comprising a semiconductor polymer characterized as having a bandgap in the visible portion of the electromagnetic spectrum, the method comprising:
combining nanocrystals that comprise a Group IV-VI compound with the semiconductor polymer, wherein the nanocrystals have a bandgap in the infrared portion of the electromagnetic spectrum, and the weight ratio of semiconductor polymer to nanocrystals is in the range of from more than about 95:5 to about 1000:1.

2. The method according to claim 1, wherein the semiconducting polymer comprises one or more of poly[1,4-phenylenevinylene], poly[2-methoxy-5-(2'-ethylhexyloxy)-1,4- phenylenevinylene], polyacetylene, polyparaphenylene, polypyrrole, polyparaphenylene sulfide, polythiophene, poly (1,4-phenylenevinylene), poly-3-methyl thiophene, polycarbazole, polyisothianaphene, poly(1,6-heptadiyne), poly(3-alkyl thiophene), where alkyl is $C_nH2_{n+1}$, for n=1 to 10, polyquinoline, poly(3-alkylsulfonate), where alkyl is $CH_2CH_2SO_3Na$ or $(CH_2)_4SO_3Na$, polyaniline, or any soluble derivative or combination thereof.

3. The method of claim 2, wherein the semiconducting polymer comprises a soluble derivative of poly(1,4-phenylenevinylene).

4. The method of claim 3, wherein the soluble derivative of poly(1,4-henyienevinylene) comprises poly[2-methoxy-5-(2'-ethylhexyloxy)-1,4-phenylenevinylene].

5. The method of claim 2, wherein the poly(3-alkyl thiophene) comprises poly(3-ethyl thiophene), poly(3-butyl thiophene), or any combination thereof.

6. The method of claim 1, wherein the Group IV-VI compound comprises PbSe.

7. The method of claim 6, wherein the Group IV-VI compound comprises PbSe nanocrystals having a particle size in the range of from about 1 nm to about 20 nm.

8. The method of claim 6, wherein the PbSe nanocrystals further comprise a plurality of surface ligands extending up to about 3 nm from the surface of the nanocrystals.

9. The method of claim 1, wherein the optoelectronic device comprises a photodiode, a photodetector, a photovoltaic cell, a light-emitting diode, a laser, or any combination thereof.

10. The method of claim 1, wherein the optoelectronic device emits or absorbs visible light.

11. The method of claim 1, wherein the optoelectronic device is capable of absorbing or emitting electromagnetic radiation, the ratio of the energy of the electromagnetic radiation that is absorbed or emitted by the optoelectronic device to the bandgap energy of the nanocrystals being in the range of from about 2 to about 4.

12. The method of claim 11, wherein the ratio of the energy of the electromagnetic radiation that is absorbed or emitted by the device to the bandgap energy of the nanocrystals is in the range of from about 2.5 to about 3.5.

13. The method of claim 1, wherein the weight ratio of semiconductor polymer to nanocrystals is in the range of from about 100:1 to about 1:1000.

14. A method of increasing the external quantum efficiency of an optoelectronic device comprising a semiconductor polymer characterized as having a bandgap in the visible portion of the electromagnetic spectrum, the method comprising:

combining nanocrystals with the semiconductor polymer,
   the nanocrystals comprising PbSe and comprising a plurality of surface ligands extending up to about 3 nm from the surface of the nanocrystals,
   the nanocrystals having a bandgap in the infrared portion of the electromagnetic spectrum, and
the weight ratio of semiconductor polymer to nanocrystals being in the range of from about 95:5 to about 1000:1.

* * * * *

UNITED STATES PATENT AND TRADEMARK OFFICE
CERTIFICATE OF CORRECTION

PATENT NO.       : 7,887,720 B2
APPLICATION NO.  : 12/608348
DATED            : February 15, 2011
INVENTOR(S)      : Marija Drndic et al.

Page 1 of 1

It is certified that error appears in the above-identified patent and that said Letters Patent is hereby corrected as shown below:

In the Claims

Column 14,
Claim 4:
Line 40, delete "poly(1,4-henyienevinylene)" and insert -- poly(1,4-phenylenevinylene) --.

Column 15,
Claim 13:
Line 5, delete "1:1000." and insert -- 1000:1. --.

Signed and Sealed this
Twenty-seventh Day of May, 2014

Michelle K. Lee
*Deputy Director of the United States Patent and Trademark Office*